United States Patent [19]

Chun

[11] Patent Number: 5,731,636
[45] Date of Patent: Mar. 24, 1998

[54] SEMICONDUCTOR BONDING PACKAGE

[75] Inventor: Heung Sup Chun, Cheongju, Rep. of Korea

[73] Assignee: LG Semicon Co., Ltd., Choongchungbook-Do, Rep. of Korea

[21] Appl. No.: 631,245

[22] Filed: Apr. 12, 1996

[30] Foreign Application Priority Data

Oct. 19, 1995 [KR] Rep. of Korea ............. 36166/1995

[51] Int. Cl.⁶ .................. H01L 23/48; H01L 23/52; H01L 29/40
[52] U.S. Cl. .................. 257/784; 257/734; 257/737; 257/738; 257/780
[58] Field of Search .................. 257/734, 737, 257/738, 780, 781, 782, 783, 785, 778, 779

[56] References Cited

U.S. PATENT DOCUMENTS

| | | | |
|---|---|---|---|
| 4,731,282 | 3/1988 | Tsukagoshi et al. | 428/220 |
| 4,740,657 | 4/1988 | Tsukagoshi et al. | 174/88 R |
| 5,120,665 | 6/1992 | Tsukagoshi et al. | 437/8 |
| 5,189,507 | 2/1993 | Carlomagno et al. | 257/777 |
| 5,598,036 | 1/1997 | Ho | 257/780 |

OTHER PUBLICATIONS

Repairable Plastic ball Grid Array Package, IBM Technical Disclosure Bulletin, vol. 38, No. 7 snd 265–266.

*Primary Examiner*—Carl W. Whitehead
*Attorney, Agent, or Firm*—Morgan, Lewis & Bockius LLP

[57] ABSTRACT

An improved semiconductor apparatus having conductive metallic protrusions formed on a bonding pad, thus improving an interconnection between a bonding pad and a bump formed on a substrate, which includes conductive metallic protrusions formed on said bonding pad of said substrate.

8 Claims, 3 Drawing Sheets

SEMICONDUCTOR BONDING PACKAGE

BACKGROUND OF THE INVENTION

1. Field of the Invention

The present invention relates to a semiconductor apparatus, and particularly to an improved semiconductor apparatus having conductive metallic protrusions formed on a bonding pad, thus improving an interconnection performance between a bonding pad and a bump formed on a substrate.

2. Description of the Conventional Art

Recently, semiconductor package fabrication technique has been widely developed since the plastic package fabrication method was introduced. A flip chip, which is characterized to directly mounting a bare chip on a substrate using bump, has been also widely developed in the industry. Here, a method of forming metallic bump on a bonding pad of the semiconductor chip is also developed; however, the interconnection between a bumped chip and a substrate is conducted in only a few method in the industry.

Referring to FIGS. 1 and 2, one of the above-mentioned methods will now be explained.

Referring to FIG. 1, the substrate 1 is formed with FR-4, glass, ceramic, or the like. In addition, a bonding pad 2 is formed on the upper surface of the substrate 1. The bonding pad 2 is formed with metal having a good conductivity such as Al or Cu.

Meanwhile, FIG. 2 shows an interconnection process of a conventional semiconductor apparatus by inserting a heterogenous conductive material between a bumped chip and a substrate. As shown therein, a semiconductor chip 3 having a bump 4 and a substrate 1 are interconnected by inserting therebetween a heterogenous conductive material such as an anisotropic conductive adhesive (ACA) or an anisotropic conductive film. This heterogenous conductive material 5 is a new material made by providing a conductive ball 5a in resin such as epoxy and has a 2-axial conductivity by controlling pressure and temperature thereof. That is, it is directed to forming an electric path between the metallic bonding pad 2 formed on the substrate 1 and the semiconductor chip 3 by inserting therebetween a conductive ball 5a contained in the heterogenous conductive material 5 as a medium acting therebetween. However, this technique has its limited electric path.

Meanwhile, referring to FIG. 3, the problems of the prior art will now be explained in more detail.

Generally, when the bump 4 is formed on the semiconductor chip 3, as shown in FIG. 3, the flatness of the surface of the bump is low. In order to overcome the above-mentioned problems, when the bump bonding is executed with respect to the substrate 1 using the heterogenous conductive material (refer to FIG. 2), the conductive ball 5a does not act its function. Therefore, the electric characteristic thereof is deteriorated, and reliability of the product is decreased.

SUMMARY OF THE INVENTION

Accordingly, it is an object of the present invention to provide a semiconductor apparatus, which overcome the problems encountered in a conventional semiconductor apparatus.

It is another object of the present invention to provide an improved semiconductor apparatus having conductive metallic protrusions formed on a bonding pad, thus improving an interconnection performance between a bonding pad and a bump formed on a substrate.

To achieve the above objects, there is provided a semiconductor apparatus, which includes conductive metallic protrusions formed on said bonding pad of said substrate.

DETAILED DESCRIPTION OF THE INVENTION

Figure 1:
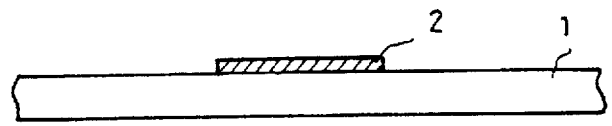
FIG. 1 is a schematic cross-sectional of a conventional substrate.
Figure 2:
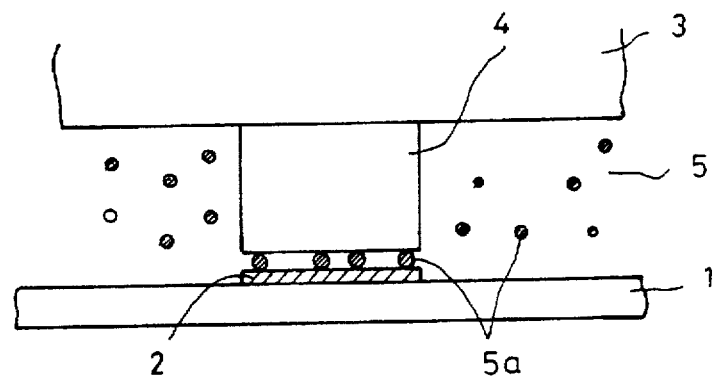
FIG. 2 is a cross-sectional view so as to show an interconnection process of a conventional semiconductor apparatus by inserting a heterogenous conductive material between a bumped chip and a substrate.
Figure 3:
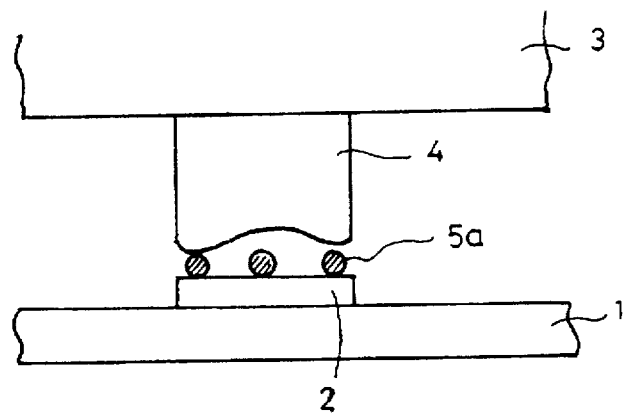
FIG. 3 is a cross-sectional view showing a conventional semiconductor apparatus of which a conductive ball is not attached to a bump.
Figure 4A:
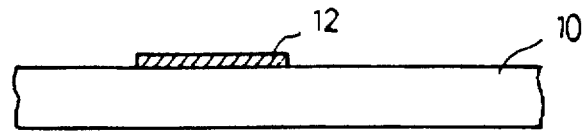
FIGS. 4A through 4E are cross-sectional views so as to show a step of forming conductive metallic protrusions on a bonding pad of a semiconductor apparatus according to the present invention.

FIGS. 4A through 4E show a process of forming conductive metallic protrusions on a bonding pad of a semiconductor apparatus according to the present invention. As shown in FIG. 4A, a bonding pad 12 is formed on the upper portion of the substrate 10. The substrate 10 is formed with either glass on which a metallic pattern is formed, or a printed circuit board, or ceramic.

Figure 4B:
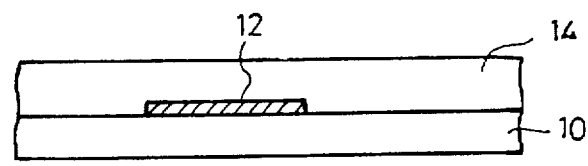

As shown in FIG. 4B, a photoresist 14 is coated on the substrate 10.

Figure 4C:
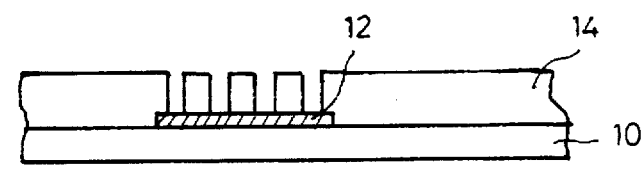
Figure 4D:
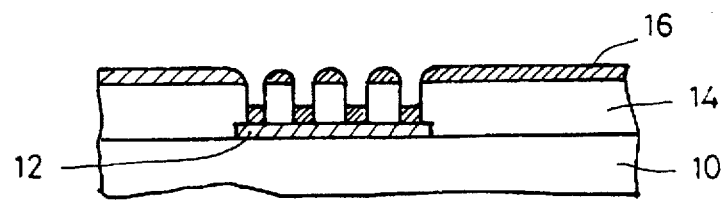
Figure 4E:
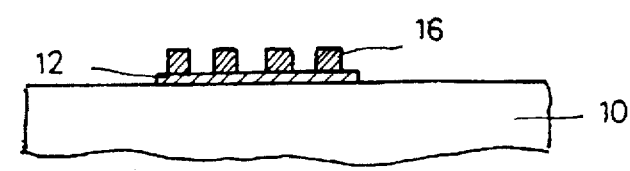

Meanwhile, the photoresist 14 is exposed and developed after masking a certain portion thereof, so that the certain portion can be patterned as shown in FIG. 4C. The conductive metal 16 is formed the thusly exposed portion as shown in FIG. 4D. This deposition process is executed by a certain deposition method such as evaporation, sputtering, or electroplating. In addition, when the photoresist 14 is lifted off, as shown in FIG. 4E, a plurality of conductive metallic protrusion 16 are formed on the bonding pad 12 formed on the upper portion of the substrate 10. The height of the conductive metallic protrusion 16 exceeds 3μm.

Figure 5:
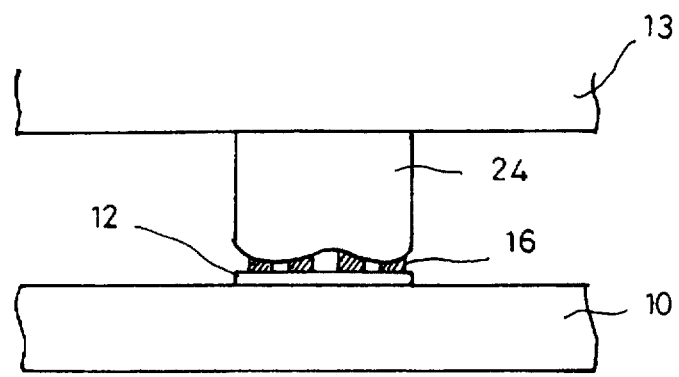
FIG. 5 is a cross-sectional view so as to show a bump interconnection state when a conductive medium is not adopted according to the present invention.

FIG. 5 shows a bump interconnection without adopting a conductive medium.

As shown in FIG. 5E, the conductive metallic protrusion 16 formed on the upper portion of the bonding pad 12 is electrically connected with the bump 24 of the semiconductor chip 13 by the thermal compression. At this time, since the conductive medium is not used, the conductive protrusion 16 is directly connected with the bump 24 by the thermal compression.

Figure 6:
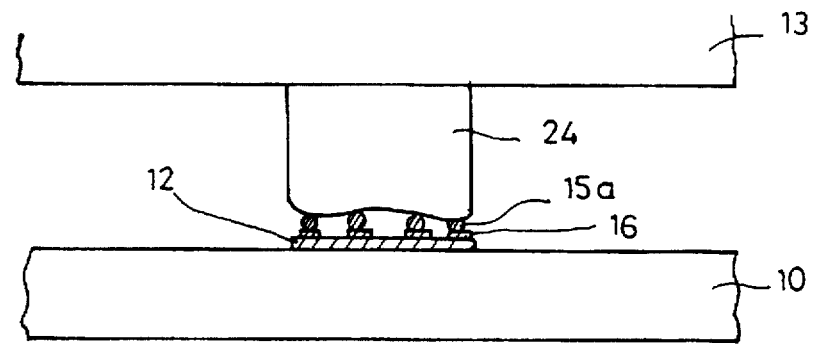
FIG. 6 is a cross-sectional view so as to show a bump interconnection state when a conductive medium is adopted according to the present invention.

FIG. 6 shows a bump interconnection with a conductive medium.

As shown therein, the conductive metallic protrusion 16 formed on the upper portion of the bonding pad 12 is electrically connected with the bump 24 and the conductive ball 15a which is inserted between the conductive metallic protrusion 16 and the bump 24. The conductive ball 15a acts as a conductive medium such as ACA or ACF and lies between the conductive metallic protrusion 16 and the bump 24. Therefore, the conductive ball 15a is compressed and electrically connected by the conductive metallic protrusion 16 and the bump 24.

As described above, the semiconductor apparatus is directed to electrically interconnecting the bonding pad having a conductive metallic protrusion and the semiconductor chip having a bump during a bonding process and securing a substantial electric path, so that electric characteristic of the product is increased.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:

1. A semiconductor bonding package for connecting with a plurality of bumps disposed on a semiconductor chip, comprising:

a substrate;

a plurality of bonding pads on the substrate;

a plurality of conductive metallic protrusions on an upper surface of each bonding pad; and a plurality of conductive balls between the bumps and the conductive metallic protrusions, the conductive metallic protrusions being electrically connected with the conductive balls using a heterogenous conductive material.

2. The semiconductor bonding package according to claim 1, wherein the conductive metallic protrusions are connected with the bumps by a thermal compression.

3. The semiconductor bonding package according to claim 1, wherein the conductive metallic protrusions are formed by one of evaporation, sputtering, or electroplating.

4. The semiconductor bonding package according to claim 1, wherein the conductive metallic protrusions have a height greater than 3 μm.

5. The semiconductor bonding package according to claim 1, wherein the substrate includes one of glass, printed circuit board, or ceramic.

6. The semiconductor bonding package according to claim 1, wherein the bonding pad includes an aluminum or copper layer.

7. The semiconductor bonding package according to claim 1, further comprising a plurality of conductors on the conductive metallic protrusions.

8. The semiconductor bonding package according to claim 7, wherein the conductors include one of an anisotropic conductive adhesive (ACA) or an anisotropic conducive film (ACF).

* * * * *

UNITED STATES PATENT AND TRADEMARK OFFICE
CERTIFICATE OF CORRECTION

PATENT NO. : 5,731,636
DATED : March 24, 1998
INVENTOR(S) : Chun

It is certified that error appears in the above-identified patent and that said Letters Patent is hereby corrected as shown below:

Column 4, line 6, delete "a".

Signed and Sealed this

Fifth Day of January, 1999

Attest:

Attesting Officer

Acting Commissioner of Patents and Trademarks